US010066809B2

(12) United States Patent
Takahira et al.

(10) Patent No.: US 10,066,809 B2
(45) Date of Patent: Sep. 4, 2018

(54) LIGHT EMITTING DEVICE WITH OPTICAL MEMBER FOR EXCITING FLUORESCENCE, ILLUMINATION DEVICE, AND VEHICLE HEADLAMP HAVING THE SAME

(71) Applicant: Sharp Kabushiki Kaisha, Osaka-Shi (JP)

(72) Inventors: Yoshiyuki Takahira, Osaka (JP); Koji Takahashi, Osaka (JP); Yosuke Maemura, Osaka (JP); Hiroshi Kijima, Osaka (JP)

(73) Assignee: SHARP KABUSHIKI KAISHA, Osaka-Shi (JP)

( * ) Notice: Subject to any disclaimer, the term of this patent is extended or adjusted under 35 U.S.C. 154(b) by 101 days.

(21) Appl. No.: 13/744,238

(22) Filed: Jan. 17, 2013

(65) Prior Publication Data

US 2013/0182452 A1 Jul. 18, 2013

(30) Foreign Application Priority Data

Jan. 18, 2012 (JP) .................................. 2012-008479

(51) Int. Cl.
| F21V 11/00 | (2015.01) |
| F21V 1/00 | (2006.01) |
| F21V 9/00 | (2018.01) |
| F21V 5/00 | (2018.01) |
| F21V 7/04 | (2006.01) |
| G01S 1/00 | (2006.01) |
| G09B 9/00 | (2006.01) |

(Continued)

(52) U.S. Cl.
CPC ................ *F21V 9/00* (2013.01); *F21S 41/12* (2018.01); *F21S 41/141* (2018.01); *F21S 41/16* (2018.01); *F21S 41/285* (2018.01)

(58) Field of Classification Search
CPC ............... F21S 48/1136; F21S 48/1225; F21S 48/1241; F21S 48/1208; F21S 41/16; F21S 41/141; F21S 41/12; F21S 41/285; G02B 21/204; G03B 21/208; F21V 9/00
USPC ....... 362/509, 510, 511, 520, 259, 326, 552, 362/553, 554, 84, 34
See application file for complete search history.

(56) References Cited

U.S. PATENT DOCUMENTS

| 5,655,832 A * | 8/1997 | Pelka et al. ............... 362/296.09 |
| 6,272,269 B1 * | 8/2001 | Naum ............................. 385/43 |

(Continued)

FOREIGN PATENT DOCUMENTS

| EP | 2 518 838 | 10/2012 |
| JP | 11-195303 | 7/1999 |

(Continued)

OTHER PUBLICATIONS

"Industrial Applications of Laser Profiling" published in Industrial Photonics on Jan. 2015 and accessed at http://www.photonics.com/Article.aspx?AID=57146 on Jul. 22, 2015.*

(Continued)

*Primary Examiner* — Erin Kryukova
(74) *Attorney, Agent, or Firm* — Morrison & Foerster LLP

(57) ABSTRACT

A headlamp (1) includes a light-emitting section (4) which emits fluorescence upon receiving excitation light from a laser element (2). Energy intensity distribution of the excitation light, which is received by the light-emitting section (4), is a top-hat distribution.

12 Claims, 10 Drawing Sheets

(51) Int. Cl.

| | |
|---|---|
| *H01S 3/00* | (2006.01) |
| *H01S 3/30* | (2006.01) |
| *G02B 5/02* | (2006.01) |
| *H01J 5/16* | (2006.01) |
| *H01P 5/00* | (2006.01) |
| *B60Q 1/12* | (2006.01) |
| *F21V 9/16* | (2006.01) |
| *F21S 41/12* | (2018.01) |
| *F21S 41/141* | (2018.01) |
| *F21S 41/20* | (2018.01) |
| *F21S 41/16* | (2018.01) |

(56) References Cited

U.S. PATENT DOCUMENTS

| | | | |
|---|---|---|---|
| 7,684,668 B2* | 3/2010 | Cianciotto et al. | 385/133 |
| 7,830,473 B2* | 11/2010 | Furuya et al. | 349/61 |
| 8,831,396 B1* | 9/2014 | Price et al. | 385/146 |
| 2002/0191160 A1* | 12/2002 | Chuang | G03B 21/208 353/85 |
| 2003/0086066 A1* | 5/2003 | Kato | G02B 27/0994 353/20 |
| 2004/0130896 A1* | 7/2004 | Brown et al. | 362/259 |
| 2004/0233675 A1* | 11/2004 | Meguro et al. | 362/373 |
| 2004/0252281 A1* | 12/2004 | Fischer | F21V 5/006 353/53 |
| 2005/0105301 A1* | 5/2005 | Takeda et al. | 362/545 |
| 2007/0242924 A1* | 10/2007 | Cianciotto et al. | 385/133 |
| 2008/0080207 A1 | 4/2008 | Specht et al. | |
| 2008/0089089 A1 | 4/2008 | Hama et al. | |
| 2009/0003400 A1 | 1/2009 | Nagahama et al. | |
| 2010/0118535 A1* | 5/2010 | Kusukame et al. | 362/259 |
| 2011/0148280 A1* | 6/2011 | Kishimoto et al. | 313/483 |
| 2011/0157865 A1* | 6/2011 | Takahashi et al. | 362/84 |
| 2011/0194302 A1 | 8/2011 | Kishimoto et al. | |
| 2011/0216286 A1 | 9/2011 | Matsumoto et al. | |
| 2011/0216550 A1 | 9/2011 | Koike et al. | |
| 2011/0279999 A1* | 11/2011 | Takahashi | G02B 6/34 362/84 |
| 2011/0280039 A1 | 11/2011 | Kishimoto | |
| 2012/0031883 A1 | 2/2012 | Kumamoto et al. | |
| 2012/0133904 A1* | 5/2012 | Akiyama | 353/38 |
| 2012/0206031 A1 | 8/2012 | Hiroki et al. | |
| 2012/0206931 A1 | 8/2012 | Nakazato et al. | |
| 2012/0236264 A1 | 9/2012 | Akiyama | |
| 2013/0088471 A1 | 4/2013 | Kitano | |
| 2013/0182452 A1 | 7/2013 | Takahira et al. | |

FOREIGN PATENT DOCUMENTS

| | | | |
|---|---|---|---|
| JP | 2004-241142 | 8/2004 | |
| JP | 2005-56608 | 3/2005 | |
| JP | 2006-350255 | 12/2006 | |
| JP | 2007-323858 | 12/2007 | |
| JP | 2010-232044 | 10/2010 | |
| JP | 2011/121082 | 6/2011 | |
| JP | 2011-165521 | 8/2011 | |
| JP | WO 2011099640 A1 * | 8/2011 | F21K 9/52 |
| JP | 2011-181381 | 9/2011 | |
| JP | 2011-222260 | 11/2011 | |
| JP | 2011-243373 | 12/2011 | |
| JP | 2012-089316 | 5/2012 | |
| JP | 2012-99222 | 5/2012 | |
| JP | 2012-169050 | 9/2012 | |
| JP | 2012-195064 | 10/2012 | |
| JP | 2012-222050 | 11/2012 | |
| JP | 2013-92752 | 5/2013 | |
| WO | WO-2006/038502 | 4/2006 | |
| WO | WO-2010/058323 | 5/2010 | |
| WO | WO-2010/061684 | 6/2010 | |
| WO | WO-2010/137475 | 12/2010 | |
| WO | WO-2011/135534 | 11/2011 | |
| WO | WO-2012/005686 | 1/2012 | |

OTHER PUBLICATIONS

Sakaue et al., U.S. Office Action dated Dec. 17, 2015, directed to U.S. Appl. No. 14/264,325; 9 pages.

Extended Search Report dated Mar. 13, 2018, directed to EP Application No. 13000197.7; 4 pages.

* cited by examiner

LIGHT EMITTING DEVICE WITH OPTICAL MEMBER FOR EXCITING FLUORESCENCE, ILLUMINATION DEVICE, AND VEHICLE HEADLAMP HAVING THE SAME

This Nonprovisional application claims priority under 35 U.S.C. § 119 on Patent Application No. 2012-008479 filed in Japan on Jan. 18, 2012, the entire contents of which are hereby incorporated by reference.

TECHNICAL FIELD

The present invention relates to a light-emitting device, an illumination device, and a vehicle headlamp, each of which utilizes fluorescent light that a phosphor generates upon irradiation with excitation light.

BACKGROUND ART

In these years, studies on light-emitting devices are becoming active, which light-emitting devices each (i) use, as an excitation light source, a semiconductor light-emitting element such as a light-emitting diode (LED) or a laser diode (LD) and (ii) use, as illumination light, fluorescent light that a light-emitting section containing a phosphor generates upon irradiation with excitation light emitted from the excitation light source.

An example of such light-emitting devices is lighting equipment for vehicle, which is disclosed in Patent Literature 1. This lighting equipment for vehicle uses an LED module or an LD module as an excitation light source, and generates white light by irradiating, with excitation light, a phosphor in the form of a small dot approximately 0.5 mm or less in diameter.

CITATION LIST

Patent Literature

Patent Literature 1
Japanese Patent Application Publication, Tokukai, No. 2004-241142 A (Publication Date: Aug. 26, 2004)

SUMMARY OF INVENTION

Technical Problem

However, the efficiency of conversion by the phosphor is approximately 90% at the maximum, and excitation light that was not converted into fluorescent light turns into heat. Therefore, as excitation density increases, temperature of the phosphor rises and the efficiency of conversion by the phosphor decreases.

Particularly, in a case where excitation is caused by excitation light in the form of a Gaussian beam (for example, a laser beam), the following problem arises. That is, the beam creates (i) a region which is irradiated with a peak (top) of the beam and (ii) a region which is irradiated with an edge portion of the beam. This results in a reduction in conversion efficiency in the region which is irradiated with the peak of the beam and, accordingly, causes a reduction in the total conversion efficiency.

Such a problem cannot be solved by the invention of Patent Literature 1.

The present invention has been made in view of the above problem, and an object of the present invention is to provide a light-emitting device capable of preventing a reduction in efficiency of conversion by a phosphor, which reduction would occur due to heat of excitation light.

Solution to Problem

In order to attain the above object, a light-emitting device in accordance with an embodiment of the present invention includes a light-emitting section which emits fluorescence upon receiving excitation light from an excitation light source, energy intensity distribution of the excitation light, which is received by the light-emitting section, being a top-hat distribution.

Advantageous Effects of Invention

As described above, a light-emitting device in accordance with the present invention includes a light-emitting section which emits fluorescent light upon receiving excitation light from an excitation light source, and is configured such that energy intensity distribution of the excitation light received by the light-emitting section is a top-hat distribution.

Therefore, it is possible to bring about the following effect. That is, the light-emitting section is not excited by excitation light that is locally high in energy intensity. Accordingly, it is possible to reduce the possibility of temperature quenching due to locally-high temperature.

DESCRIPTION OF EMBODIMENTS

Embodiment 1

The following description discusses an embodiment of the present invention with reference to FIGS. 1 to 5.

<Technical Idea of the Present Invention>

Figure 2:
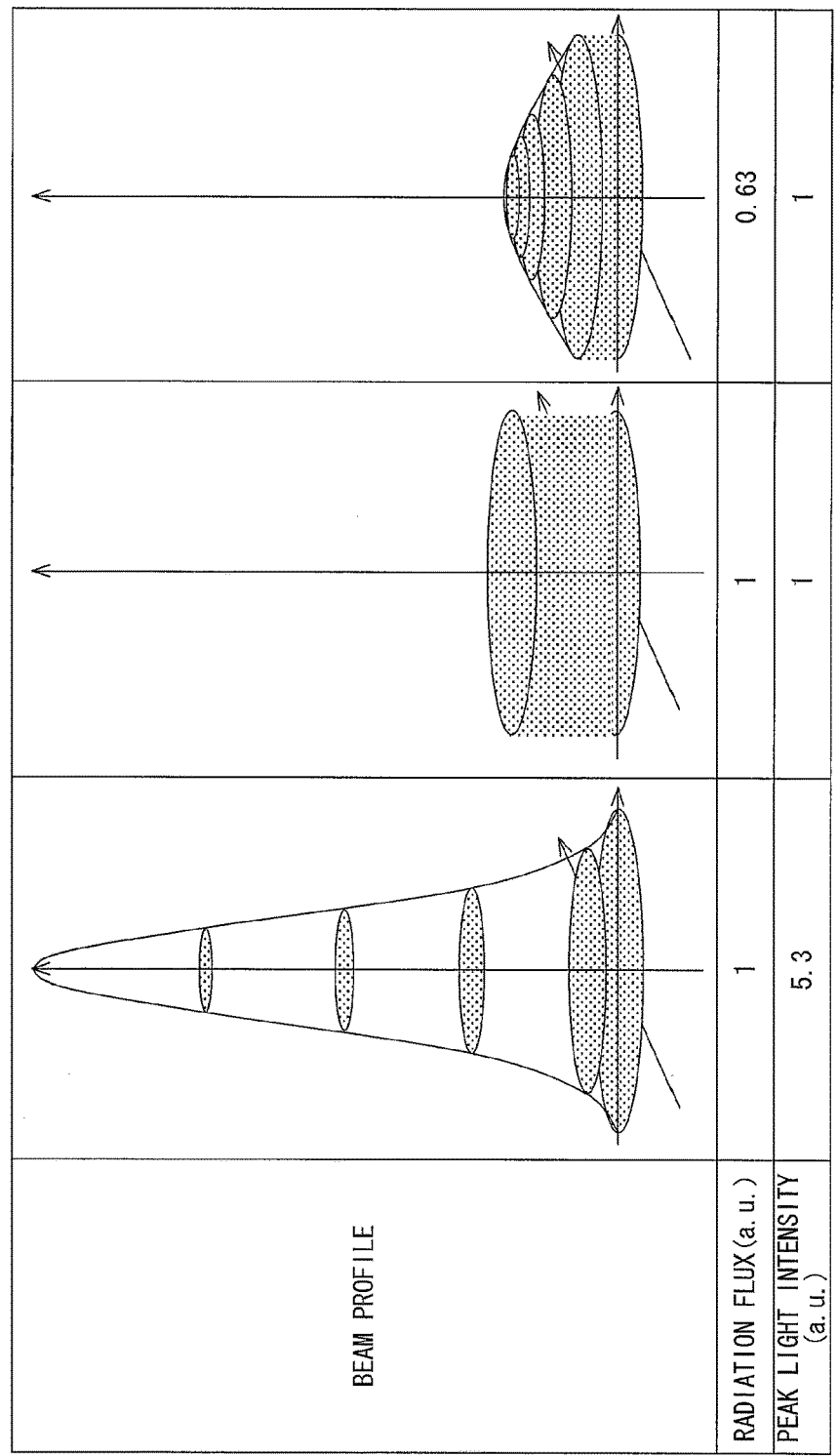
FIG. 2 is a view illustrating types of spatial light intensity distribution of excitation light.

First, with reference to FIG. 2, a technical idea of the present invention is described. FIG. 2 is a view illustrating types of spatial light intensity distribution of excitation light.

In a light collection optical system, a spot size of collected light is determined by (i) an angle of divergence of an excitation light source and (ii) a size of the excitation light source. Therefore, a size of an excitation light source is important in the light collection optical system.

In a case where a semiconductor laser is used as an excitation light source, the spatial light intensity distribution of a laser beam emitted from the semiconductor laser is usually a Gaussian distribution (the leftmost beam profile in FIG. 2). According to the Gaussian distribution, the energy intensity is different between (i) a region irradiated with a peak (top) of the laser beam and (ii) a region irradiated with an edge portion of the laser beam.

Another example of the spatial light intensity distribution is a top-hat distribution (the beam profile in the middle shown in FIG. 2). The top-hat distribution is such that the energy intensity of excitation light across a surface which is irradiated with the excitation light is almost uniform.

Assume that the amount of light is the same and beam width is the same for a Gaussian distribution and a top-hat distribution. In this case, the light intensity in a region irradiated with a peak of excitation light in the Gaussian distribution may be five times as high as the light intensity in the top-hat distribution.

Excitation light which was not converted into fluorescence becomes heat. Therefore, temperature of a phosphor rises as excitation density increases. When the temperature of the phosphor rises, the efficiency of conversion by the phosphor decreases due to temperature quenching. Therefore, when irradiation is carried out with the excitation light having a Gaussian distribution, the conversion efficiency in a region irradiated with a peak of the excitation light decreases, and accordingly the total conversion efficiency may decrease. As a result, the total luminous flux of obtained fluorescence may decrease (may become darker) than those obtained by irradiation with excitation light having a top-hat distribution.

In order to solve the above problem, according to the present invention, a beam having a top-hat profile is used as excitation light with which the light-emitting section containing a phosphor is to be irradiated. This prevents a reduction in the efficiency of conversion by the phosphor due to heat of the excitation light.

Further, a Gaussian profile has the following problem. Since a Gaussian profile begins and ends with gradual curves, a contrast between a part which is excited and a part which is not excited is poor, and an optical design becomes complicated. That is, the edge portion of the beam cannot be used optically.

This problem can be solved by irradiation with excitation light having a top-hat distribution.

Note that, in a case where a beam having a Gaussian distribution, which beam (i) has a peak intensity that is the same as the intensity of a beam having a top-hat distribution and (ii) has the same width as the beam having the top-hat distribution (the rightmost beam profile in FIG. 2), is compared with the beam having the top-hat distribution, the radiation flux of the beam having the Gaussian distribution is 60% of the beam having the top-hat distribution. Further, in this case, excitation light emitted from a part of a light source, which part is outside a region corresponding to the necessary size of the light source, becomes stray light in a light collection optical system, and forms an unintended image. This necessitates an additional optical part(s) such as a slit for blocking the stray light. Therefore, it is preferable to irradiate with excitation light having a top-hat distribution.

<Configuration of Headlamp 1>

The following describes a headlamp (a vehicle headlamp) 1 as an example of a light-emitting device or an illumination device in accordance with one embodiment of the present invention. The headlamp 1 meets the standards for light distribution characteristics of a driving headlamp (high beam) for automobiles. Note, however, that the illumination device in accordance with the one embodiment of the present invention can be a headlamp for passing (low beam). Further, the illumination device in accordance with the one embodiment of the present invention can be realized as a headlamp for a vehicle or a moving object other than the automobile (for example, person, ship, vessel, airplane, submarine, rocket, or the like), or can be realized as an illumination device for other applications. The examples of such an illumination device include a search light, a projector, a household illumination apparatus, a commercial illumination device, and an exterior illumination device.

Figure 3:
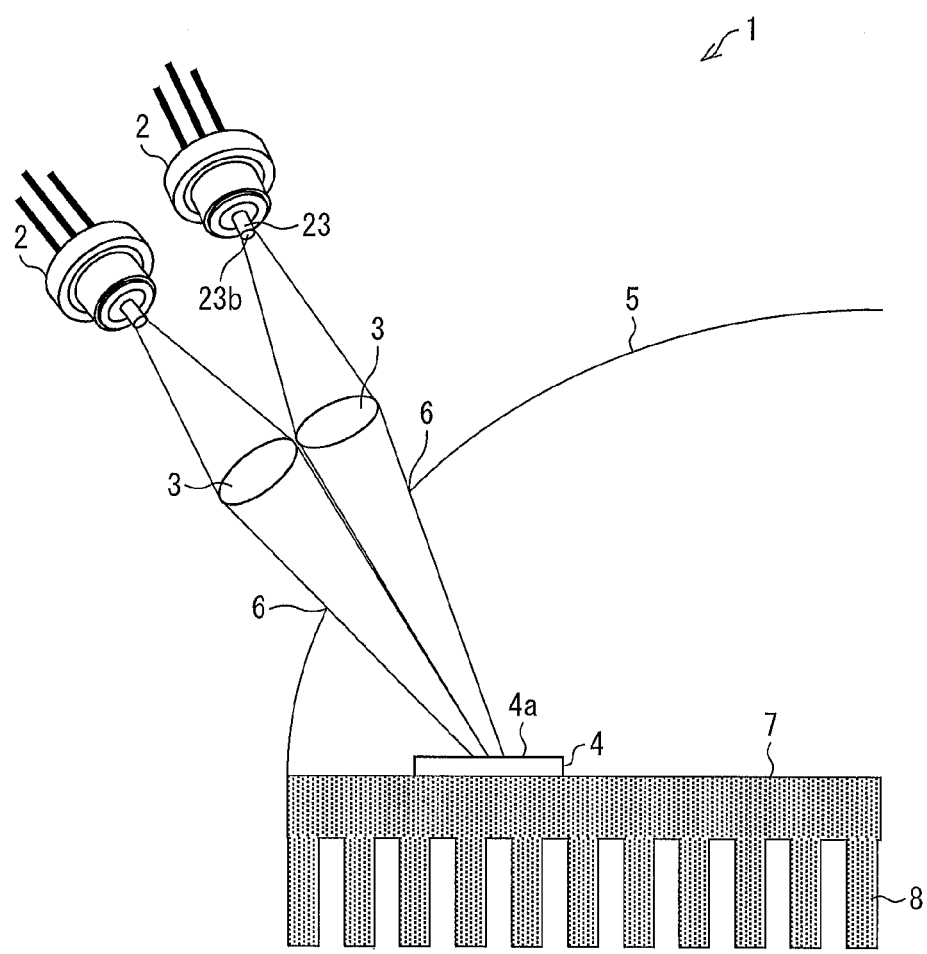
FIG. 3 is a cross sectional view schematically illustrating a configuration of a headlamp in accordance with an embodiment of the present invention.

FIG. 3 is a cross-sectional view schematically illustrating a configuration of a headlamp (vehicle headlamp) in accordance with the one embodiment of the present invention. As illustrated in FIG. 3, the headlamp 1 includes laser elements (excitation light sources) 2, lenses (second optical members) 3, a light-emitting section 4, a parabolic mirror (a projection member, a reflector) 5, a metal base 7, and a fin 8.

The headlamp 1 is configured to generate fluorescence by irradiating the light-emitting section 4 with excitation light emitted from the laser elements 2. The fluorescence is used as illumination light. The energy intensity distribution of the excitation light emitted to the light-emitting section 4 of the headlamp 1 is a top-hat distribution.

(Laser Element 2)

A laser element 2 is a light-emitting element, which functions as an excitation light source which emits excitation light. An example of the laser element 2 is a semiconductor laser. Strictly speaking, a laser chip 21 (see FIG. 1) included in the laser element 2 can be regarded as an excitation light source. The laser element 2 includes an optical rod 23 (a first optical member) for converting the energy intensity distribution of a laser beam into a top-hat distribution by internal multiple reflection. The configuration of the laser element 2 is described later in detail.

The headlamp 1 can include a plurality of laser elements 2. In this case, each of the plurality of laser elements 2 emits, by laser oscillation, a laser beam serving as excitation light. The number of laser elements 2 can be only one, but the use of a plurality of laser elements 2 makes it easier to obtain a high-power laser beam.

Further, the laser element 2 can be one that has a light-emitting point in a single chip or one that has a plurality of light-emitting points in a single chip. The wavelength of a laser beam from the laser element 2 is for example 405 nm (blue-violet) or 450 nm (blue). Note, however, that the wavelength is not limited to those. It is only necessary to select wavelength as appropriate depending on the types of phosphor to be included in the light-emitting section 4.

The excitation light source of the headlamp 1 can be an LED. Note, however, that it is preferable to use a semiconductor laser as the excitation light source, because the semiconductor laser couples light with the optical rod 23 more efficiently than the LED.

(Lens 3)

A lens 3 is a second optical member which directs, to the light-emitting section 4, a laser beam emitted from the optical rod 23 of the laser element 2. The lens 3 controls the spot size of a laser beam and directs the laser beam to the light-emitting section 4.

By providing the lens 3, it is possible to cause an exit surface 23b of the optical rod 23 and a spot of excitation light incident on the light-emitting section 4 to be optically conjugate with each other. This makes it possible to easily control a spot size of the excitation light on the light-emitting section 4.

By changing the design of a curved surface of the lens 3 or changing the distance between the lens 3 and the light-emitting section 4, it is possible to change a spot size of a laser beam on a laser beam irradiation surface 4a of the light-emitting section 4.

The lens 3 is for example a convex lens. The lens 3 is provided so as to correspond to each laser element 2. The positions of the lens 3 and the laser element 2 are determined such that the exit surface 23b of the optical rod 23 coincides with one focal point of the lens 3. The positions of the lens 3 and the light-emitting section 4 are determined such that the laser beam irradiation surface 4a of the light-emitting section 4 coincides with the other focal point of the lens 3.

A laser beam that comes out of the optical rod 23 is a laser beam which has a spatial light intensity distribution in the form of a top-hat profile, and the lens 3 directs this laser beam to the light-emitting section 4 (described later).

The second optical member included in the headlamp 1 can be a concave mirror, instead of the lens 3. The second optical member is not particularly limited, provided that the second optical member is capable of controlling a spot size of a laser beam.

(Light-Emitting Section 4)

The light-emitting section 4 is one that emits fluorescence upon receiving a laser beam emitted from the laser element 2, and contains a phosphor(s) (fluorescent material(s)) which emits light upon receiving a laser beam. Specifically, the light-emitting section 4 is (i) one that is obtained by dispersing phosphors in a sealing member or (ii) one that is obtained by solidifying a phosphor. The light-emitting section 4 converts a laser beam into fluorescence. Therefore, the light-emitting section can be regarded as a wavelength conversion element.

The light-emitting section 4 is provided on the metal base 7 and substantially at a focal point of the parabolic mirror 5. Therefore, fluorescence emitted from the light-emitting section 4 is reflected by a reflective curved surface of the parabolic mirror 5, thereby the path of the fluorescence is controlled. On the laser beam irradiation surface 4a of the light-emitting section 4, an antireflection structure for preventing reflection of a laser beam can be provided.

Examples of the phosphor included in the light-emitting section 4 include oxynitride phosphor (for example, sialon phosphor), nitride phosphor (for example, CASN ($CaAlSiN_3$), and III-V group compound semiconductor nanoparticle phosphor (for example, indium phosphide: InP). Note, however, that the phosphor included in the light-emitting section 4 is not limited to those listed above, and can be other phosphors.

Note that the law demands that illumination light emitted from a headlamp must be white that has a chromaticity falling within a specific range. Therefore, the light-emitting section 4 contains a phosphor(s) which is/are selected so as to obtain illumination light of specified white.

For example, when blue, green, and red phosphors are included in the light-emitting section 4 and these phosphors are irradiated with a 405-nm laser beam, white light is generated. Alternatively, it is possible to obtain white light by providing a yellow phosphor (or green and red phosphors) in the light-emitting section 4 and irradiating it with a 450-nm laser beam (blue) (or a laser beam of so-called "close to blue" which has a peak wavelength falling within a wavelength range from 440 nm to 490 nm).

The sealing member of the light-emitting section 4 is for example a glass material (inorganic glass, organic-inorganic hybrid glass) or a resin material such as a silicone resin. The glass material can be low-melting glass. It is preferable that the sealing member is highly transparent. In a case where a laser beam is high in power, it is preferable that the glass material is highly resistant to heat.

(Parabolic Mirror 5)

The parabolic mirror 5 is an example of a projection member which reflects fluorescence generated by the light-emitting section 4 and forms a bundle of rays (illumination light) which travels within a predetermined solid angle. The parabolic mirror 5 can be for example a member that has a metal film on its surface or can be a member made of metal.

A reflective surface of the parabolic mirror 5 includes at least a part of a partial curved surface, which is obtained by (i) rotating a parabola about its symmetric axis so as to form a curved surface (parabolic surface) and (ii) cutting the curved surface along a plane including the symmetric axis.

The laser element 2 is provided outside the parabolic mirror 5, and the parabolic mirror 5 has a window 6 which allows a light beam to transmit or pass therethrough. The window 6 can be (i) an opening or (ii) a part that includes a transparent material capable of transmitting a laser beam. For example, the window 6 can be a transparent plate provided with a filter that transmits a laser beam but reflects white light (fluorescence emitted from the light-emitting section 4). With this configuration, it is possible to prevent fluorescence, which is emitted from the light-emitting section 4, from leaking out of the window 6.

One window 6 shared by a plurality of laser elements 2 can be provided, or a plurality of windows 6 corresponding to a respective plurality of laser elements 2 can be provided.

Note that the parabolic mirror 5 can include a part that is not a parabola. Further, a reflecting mirror (reflector) of the light-emitting device in accordance with the one embodiment of the preset invention can be (i) one that includes a parabolic mirror having a closed circular opening or (ii) one that includes a part of the parabolic mirror. Further, the reflecting mirror is not limited to the parabolic mirror, and can be an ellipsoidal mirror, a free-form surface mirror or a multi-mirror.

Further, a lens can be used as a projection member for projecting, in a desired direction, illumination light that includes fluorescence emitted from the light-emitting section 4. The lens is an optical system which projects fluorescence in a predetermined direction by transmitting and refracting the fluorescence.

The light-emitting section 4, which is excited by a laser beam having an energy intensity distribution in the form of a top-hat profile, emits fluorescence having an energy intensity distribution in the form of a top-hat profile. In a case where such fluorescence is projected by the foregoing projection member (for example, the parabolic mirror 5), almost all of the luminous flux of the fluorescence emitted from the light-emitting section 4 can be used. This makes it possible to achieve a highly efficient projection system.

(Metal Base 7)

The metal base 7 is a supporting member in the form of a plate for supporting the light-emitting section 4, and is made of metal (for example, aluminum or copper). Therefore, the metal base 7 has a high thermal conductivity and is capable of efficiently dissipating heat generated by the light-emitting section 4.

Note that the supporting member which supports the light-emitting section 4 is not limited to those made of metal, and can be a member that contains a material having a high thermal conductivity (silicon carbide, aluminum nitride, or the like) other than metal. Note, however, that a surface of the metal base 7, which surface abuts the light-emitting section 4, preferably functions as a reflection surface. With the configuration in which the surface is as a reflection surface, it is possible, after a laser beam that has entered the light-emitting section 4 through the laser beam irradiation surface 4a of the light-emitting section 4 is converted into fluorescence, to cause the fluorescence to be reflected at the reflection surface and to direct the fluorescence toward the parabolic mirror 5. Alternatively, it is possible to cause a laser beam that has entered the light-emitting section 4 through the laser beam irradiation surface 4a of the light-emitting section 4 to be reflected by the reflection surface so that the laser beam travels back to the inside of the light-emitting section 4 and is converted into fluorescence.

(Fin 8)

The fin 8 functions as a cooling section (heat dissipation structure), which cools the metal base 7. The fin 8 has a plurality of heat dissipating plates, thereby the area in contact with air is increased so that heat dissipation efficiency increases. The cooling section for cooling the metal base 7 is not limited provided that it has a cooling function (a function of dissipating heat), and can be of a heat-pipe type, water-cooling type or air-cooling type.

<Details of Laser Element 2>

Figure 1:
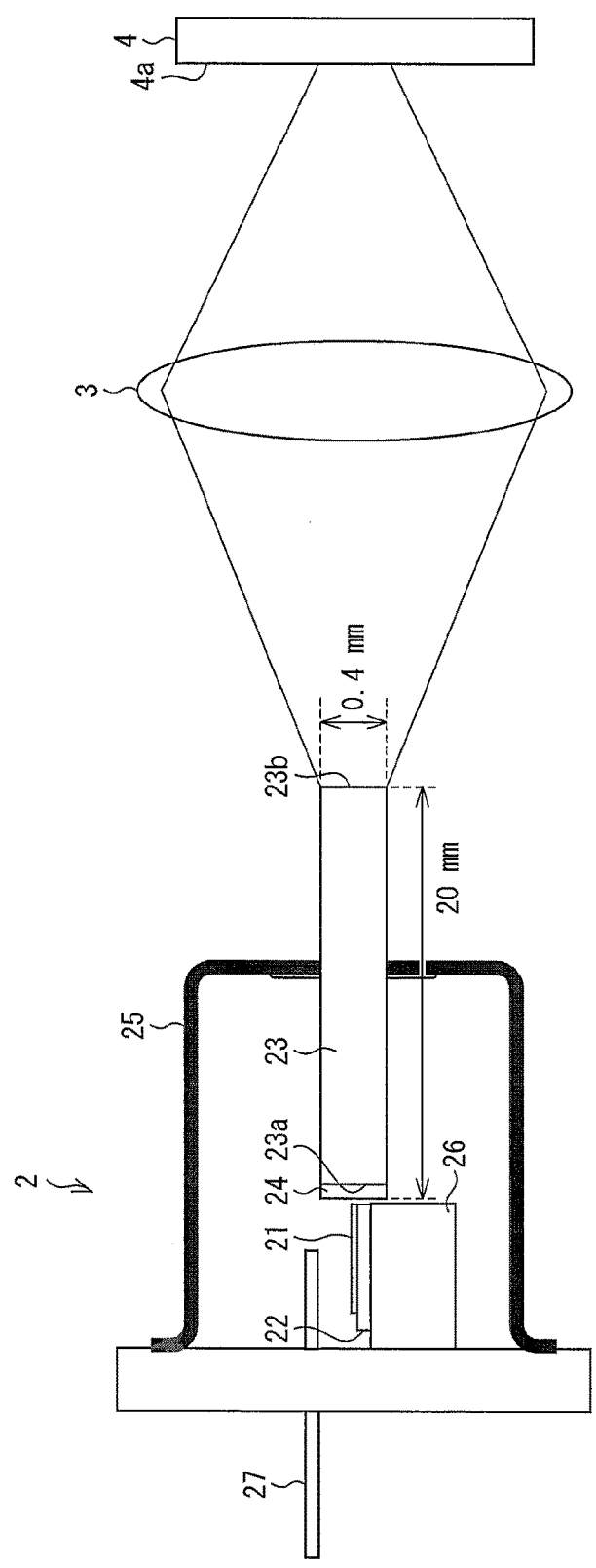
FIG. 1 is a view schematically illustrating a configuration of a laser element in accordance with an embodiment of the present invention.

FIG. 1 is a view schematically illustrating a configuration of the laser element 2 in accordance with the present embodiment. As illustrated in FIG. 1, the laser element 2 includes a laser chip (excitation light source) 21, a sub-mount 22, an optical rod 23, an AR (Anti Reflection) coating film 24, a cap 25, a stem 26, and a lead terminal 27.

(Laser Chip 21 Etc.)

The laser chip 21 is a semiconductor laser element in the form of a chip, which emits a laser beam serving as excitation light. The configuration of the laser chip 21 (for example, a material of a semiconductor layer) is not limited in particular. The laser chip 21 is fixed on the sub-mount 22, and the sub mount 22 is fixed on the stem 26.

The sub-mount 22 functions as a heat sink for exhausting heat that would be generated when the laser chip 21 operates. Therefore, the sub-mount 22 can be made of aluminum nitride and/or SiC which have high thermal conductivity.

The stem 26 can be made of gold-plated iron, gold-plated copper, or the like. It is preferable that the stem 26 is also made of a metal that has high thermal conductivity, in view of exhausting heat that would be generated in the laser chip 21.

The laser chip 21 is connected with the lead terminal 27 via thin gold lines (not illustrated), and electricity is supplied from an external power supply via these lines.

(Optical Rod 23)

The optical rod 23 is an optical member (a first optical member) which converts the energy intensity distribution of a laser beam, which is emitted from the laser chip 21, into a top-hat distribution. The optical rod 23 has (i) an entrance surface 23a for receiving a laser beam and (ii) an exit surface 23b through which the laser beam goes out. The entrance surface 23a is at one end of the optical rod 23, whereas the exit surface 23b is at the other end of the optical rod 23.

The entrance surface 23a lies in the vicinity of a light-emitting point of the laser chip 21, and allows a laser beam emitted from the light-emitting point to enter the optical rod 23 therethrough.

The laser beam emitted from the light-emitting point is light having a spatial light intensity distribution in the form of a Gaussian profile, but is converted into light having a spatial light intensity distribution in the form of a top-hat profile by multiple reflection while passing through the optical rod 23.

An exit end which includes the exit surface 23b extends out of the laser element 2 through the cap 25. The exit surface 23b coincides with one focal point of the lens 3. Therefore, the laser beam from the exit surface 23b is efficiently directed, by the lens 3, to the laser beam irradiation surface 4a of the light-emitting section 4.

Further, the AR coating film (antireflection structure) serving as an antireflection film is provided on the entrance surface 23a. This makes it possible to prevent the laser beam from being reflected by the entrance surface 23a, and thus possible to reduce losses of the laser beam which would occur when the laser beam enters the optical rod 23. The AR coating film 24 can be provided on the exit surface 23b. Note that the AR coating film 24 is an example of the antireflection structure, and therefore some other antireflection structure (e.g. an antireflection structure including a moth-eye structure or the like) can be provided on the entrance surface 23a.

Not that the exit end, which includes the exit surface 23b, does not necessarily have to extend out of the laser element 2. The exit surface 23b can be positioned inside the cap 25, and a cap glass (window) which transmits a laser beam from the exit surface 23b can be provided to the cap 25. Whether or not to cause the exit end which includes the exit surface 23b to extend out of the laser element 2 depends on the length of the optical rod 23, which length is necessary for converting a laser beam into light having a spatial light intensity distribution in the form of a top-hat profile.

According to an example illustrated in FIG. 1, the length of the optical rid 23 is 20 mm, and the diameter of the rod is 0.4 mm. Note, however, that the size of the optical rod 23 is not limited to the above.

Figure 4:
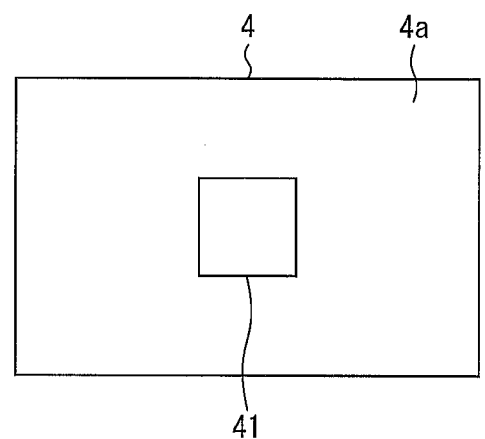
FIG. 4 is a view illustrating an example of shape of a laser beam spot on a laser beam irradiation surface of a light-emitting section.

FIG. 4 is a view illustrating an example of a shape of a laser beam spot 41 on the laser beam irradiation surface 4a of the light-emitting section 4. The optical rod 23 is for example a rectangular prism, and the exit surface 23b is a quadrangle (for example, rectangle or square). The shape of the laser beam spot 41 corresponds to a shape of the exit surface 23b. Therefore, it is possible to change the shape of the laser beam spot 41 to a desired shape by changing the shape of the exit surface 23b.

With the configuration in which the exit surface 23b of the optical rod 23 is polygonal in shape, in a case where a plurality of optical rods 23 or a plurality of laser beam spots 41 are to be arranged next to each other, a space between the optical rods 23 or between the laser beam spots is reduced. As a result, it is possible to increase the density of a laser beam, and possible to achieve efficient irradiation.

Figure 5:
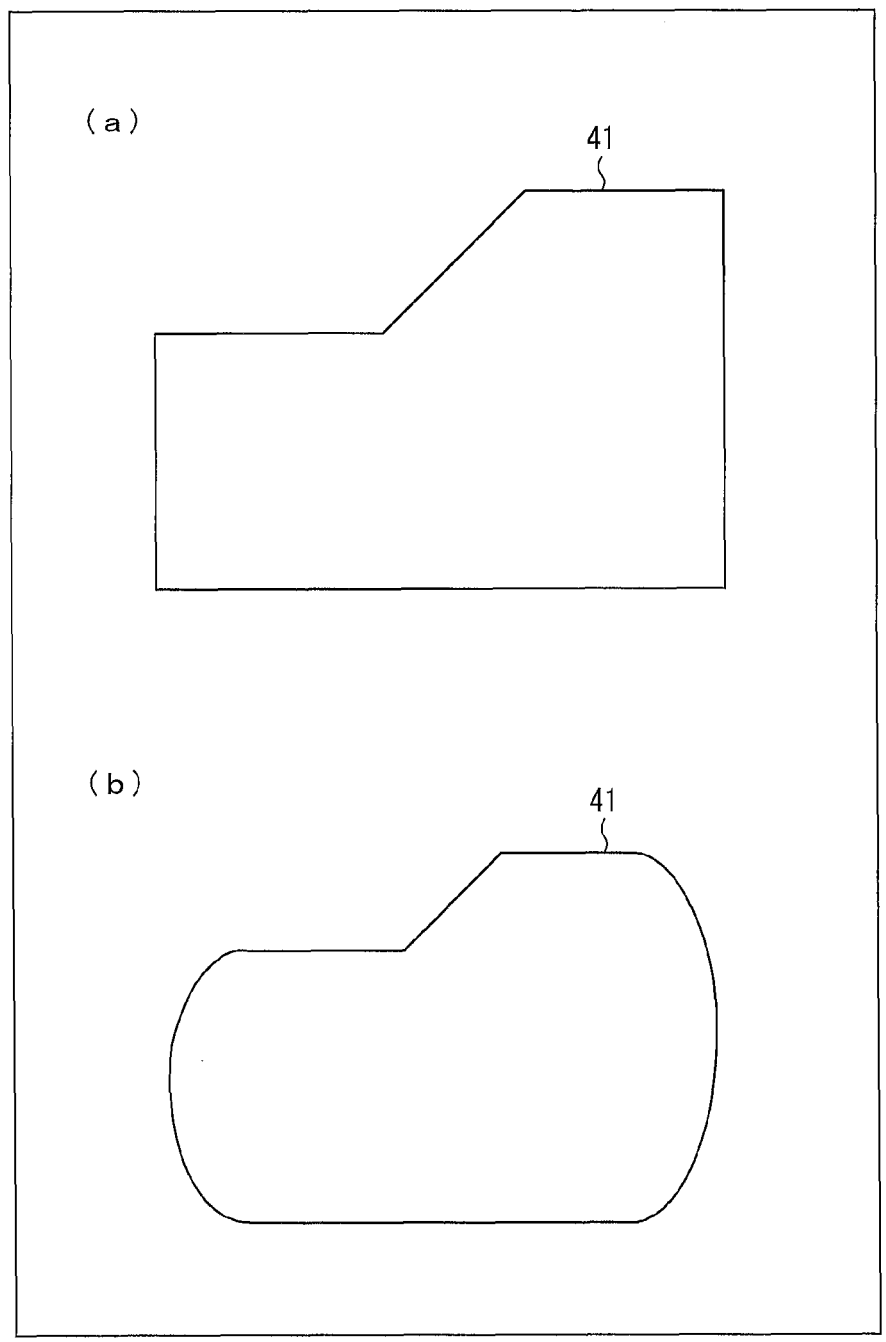
FIG. 5 (*a*) and (*b*) of FIG. 5 are views illustrating other examples of shapes of a laser beam spot on a laser beam irradiation surface of a light-emitting section.

(a) and (b) of FIG. 5 are views illustrating other examples of the shape of the laser beam spot 41 on the laser beam irradiation surface 4a of the light-emitting section 4. As illustrated in (a) of FIG. 5, the shape of the exit surface 23b can be determined so that the laser beam spot 41 is more complicated polygonal in shape. Alternatively, as illustrated in (b) of FIG. 5, the shape of the laser beam spot 41 can be the one that includes a curved portion and an angular portion.

The illumination light emitted from the headlamp 1 forms an illumination light spot in a shape corresponding to the shape of the laser light spot 41 on the light-emitting section 4.

The laser beam spots 41 illustrated in (a) and (b) of FIG. 5 each have a shape corresponding to the light distribution characteristic of a headlamp for passing (low beam). By employing the laser beam spot 41 having such a shape (that is, the exit surface 23b having such a shape), it is possible to realize a light distribution pattern that corresponds to the light distribution characteristic of headlamp for passing (low beam).

That is, the optical rod 23 has the exit surface 23b through which a laser beam goes out, and the shape of the exit surface 23b corresponds to a desired light distribution pattern. This technical idea can also be applied to a first optical member 29 and a multimode fiber 31 (described later).

Conventionally, a predetermined light distribution pattern has been realized by blocking part of illumination light with a mask (interception plate) or a mirror cut. However, this configuration causes losses of the illumination light. By employing the exit surface 23b having a shape corresponding to a desired light distribution characteristic, it is possible to realize the desired light distribution characteristic without causing losses of illumination light.

(Cap 25)

The cap 25 is a member for enclosing or sealing therein members such as the laser chip 21. In particular, with the cap 25, the relative positions of the laser chip 21 and the optical rod 23 are fixed. The cap 25 can be hollow, or can be filled with a substance such as resin or low-melting glass. Alternatively, the entire cap 25 can be made of low-melting glass.

<Effects of Headlamp 1>

The headlamp 1 is configured such that the optical rod 23 is provided to the laser element 2, which optical rod converts the spatial energy intensity distribution of a laser beam emitted from the laser chip 21 into a top-hat distribution. With this configuration, the laser beam having a top-hat profile passes through the lens 3 and strikes the laser beam irradiation surface 4a of the light-emitting section 4.

Therefore, the laser beam irradiation surface 4a is irradiated with a laser beam that has an almost uniform light intensity. As a result, it is possible to prevent the following problem. That is, the temperature of a part of the laser beam irradiation surface 4a rises due to the laser beam, and the efficiency of conversion by the phosphor in that part decreases.

Further, the spatial light intensity distribution in the form of a Gaussian profile has the following problem. That is, since the intensity of the laser beam on the laser beam irradiation surface 4a gradually changes from high to low as it spreads on the laser beam irradiation surface 4a, a contrast between a part which is excited by a laser beam and a part which is not excited by a laser beam is poor. In contrast, by irradiating the laser beam irradiation surface 4a of the light-emitting section 4 with a laser beam having a spatial light intensity distribution in the form of a top-hat profile, it is possible to increase a contrast between a part which is excited by a laser beam and a part which is not excited by a laser beam. This enables easy optical design of the headlamp 1 and effective use of light beams.

The light-emitting section can be classified into two types, depending on a relationship between (i) a direction from which a laser beam is incident on the light-emitting section 4 and (ii) a direction in which fluorescence is emitted from the light-emitting section 4.

In the subject application, a light-emitting section that (i) receives, on its laser beam irradiation surface 4a, a laser beam emitted from the laser element 2 and (ii) emits fluorescence mainly to the opposite side of the laser beam irradiation surface 4a is referred to as "a transmissive light-emitting section". According to a configuration including a transmissive light-emitting section, for example, the light-emitting section 4 is provided at an opening of a substrate so that (i) a laser beam incident on the light-emitting section 4 is converted into fluorescence and (ii) the fluorescence is emitted mainly to the side opposite to the side on which the laser element 2 is provided.

In a case where the light-emitting section 4 is a transmissive light-emitting section, a laser beam is scattered and thus a spatial light intensity distribution is expanded inside the light-emitting section 4. Therefore, it may be not necessary to provide an optical member for realizing a spatial light intensity distribution in the form of a top-hat profile. Note however that, even in this case, a spatial light intensity distribution in the form of a Gaussian profile is kept. Therefore, the above case does not mean that a spatial light intensity distribution in the form of a top-hat profile is realized.

On the other hand, a light-emitting section that (i) receives a laser beam emitted from the laser element 2 and (ii) emits fluorescence mainly to the side on which the laser element 2 is provided is referred to as a "reflective light-emitting section" in the subject application. According to the reflective light-emitting section 4 illustrated in FIG. 3, the most intensive part of a distribution of fluorescence emitted from the light-emitting section 4 is included in a space where there is the laser beam irradiation surface 4a of the light-emitting section 4 which receives a laser beam. The space is one of two spaces separated by a plane that includes a surface on which the light-emitting section 4 is provided (i.e., a surface of the metal base 7). The reflective light-emitting section can be realized by leaving a space between the optical rod 23 (a first optical member) and the light-emitting section 4.

Note that, in a case where the light-emitting section 4 is a reflective light-emitting section, part of a laser beam may pass through the light-emitting section 4. Even in this case, provided that fluorescence is emitted mainly to the side on which the laser element 2 is provided, such a light-emitting section is referred to as a reflective light-emitting section.

As described earlier, according to a transmissive light-emitting section, spatial light intensity distribution may be expanded due to scattering of a laser beam. Therefore, the light-emitting device in accordance with the one embodiment of the present invention will be technically valuable if realized as a light-emitting device including a reflective light-emitting section. Note, however, that the present invention can be employed for the purpose of realizing a spatial light intensity distribution in the form of a top-hat profile in a light-emitting device including a transmissive light-emitting section.

Further, in a case where the light-emitting section 4 is a transmissive light-emitting section, it may be difficult to form the laser beam spot 41 in a desired shape because a laser beam is diffused while passing through the light-emitting section 4. Therefore, in a case where the exit surface 23b having a shape corresponding to a desired light distribution characteristic is to be employed, the present invention is preferably realized as a light-emitting device including a reflective light-emitting section rather than a transmissive light-emitting section.

Embodiment 2

Figure 6:
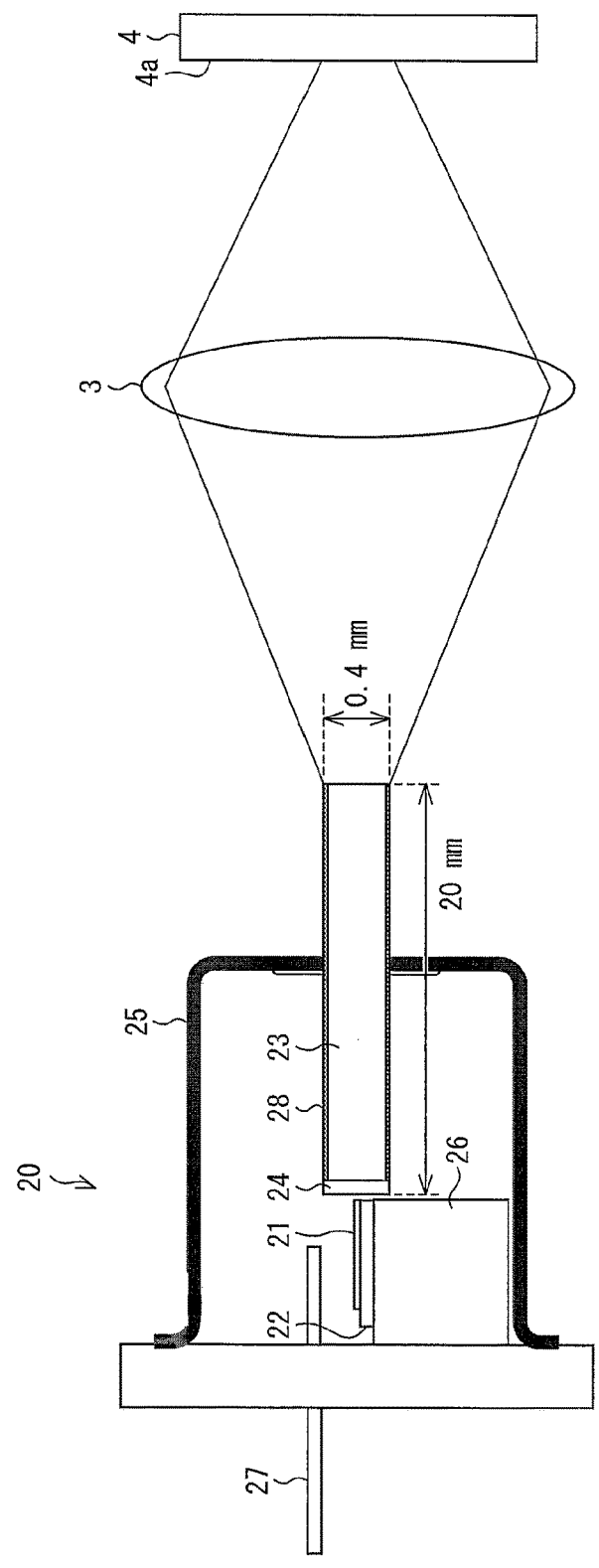
FIG. 6 is a view schematically illustrating a configuration of a laser element in accordance with another embodiment of the present invention.

The following description discusses another embodiment of the present invention with reference to FIG. 6. Note that members which are the same as those in Embodiment 1 are assigned identical reference numerals, and their descriptions are omitted here.

According to the present embodiment, the headlamp 1 includes a laser element 20 instead of the laser element 2. The other configurations are the same as those Embodiment 1.

<Configuration of Laser Element 20>

FIG. 6 is a view schematically illustrating a configuration of the laser element 20 which is applicable to the headlamp 1. According to the laser element 20, a side surface of the optical rod 23 is coated with an aluminum coating 28.

Therefore, it is possible to prevent a laser beam from leaking out of the side surface of the optical rod 23 when the laser beam passes through the optical rod 23.

Note that a film with which the side surface of the optical rod 23 is coated is not limited to an aluminum coating, and can be a reflective film made of other highly-reflective material.

Embodiment 3

Figure 7:
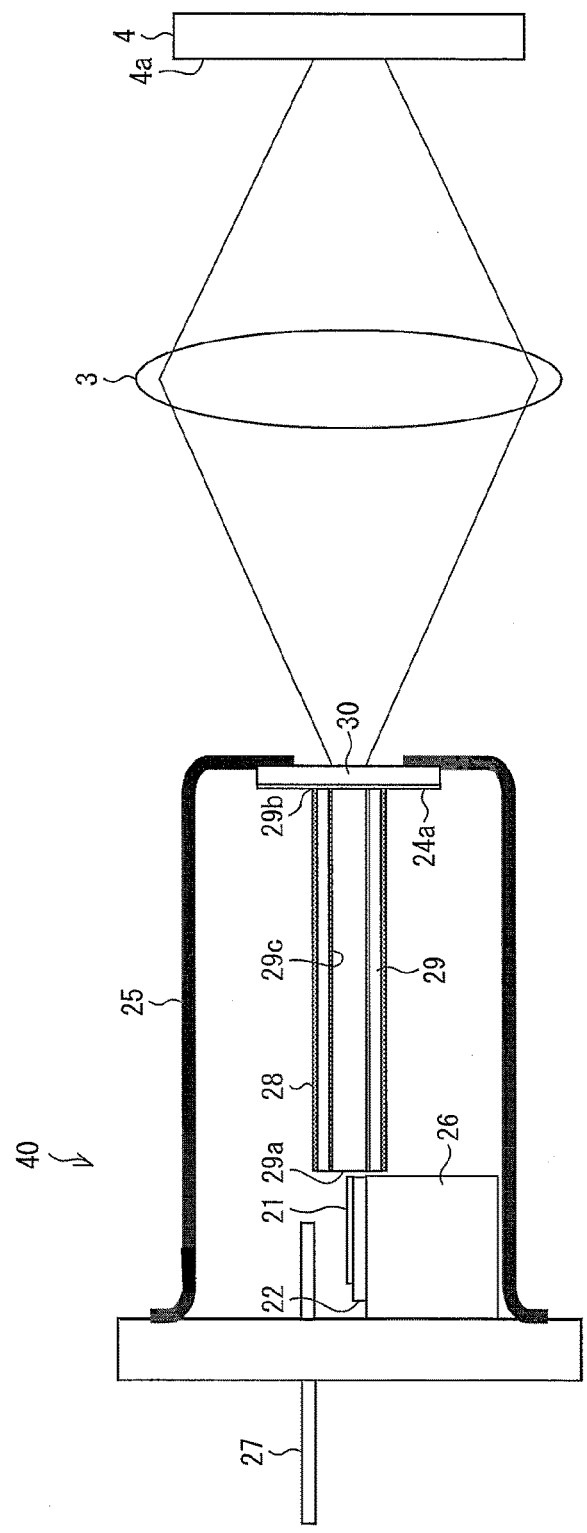
FIG. 7 is a view schematically illustrating a configuration of a laser element in accordance with a further embodiment of the present invention.

The following description discusses a further embodiment of the present invention with reference to FIG. 7. Note that members which are the same as those in Embodiments 1 and 2 are assigned identical reference numerals, and their descriptions are omitted here.

According to the present embodiment, the headlamp 1 includes a laser element 40 instead of the laser element 2. The other configurations are the same as those of Embodiments 1 and 2.

<Configuration of Laser Element 40>

FIG. 7 is a view schematically illustrating a configuration of the laser element 40 applicable to the headlamp 1. The laser element 40 includes a first optical member 29 instead of the optical rod 23. The first optical member 29 in accordance with the present embodiment is a hollow member which has a plurality of inner surfaces 29c serving as reflective surfaces.

The material and the configuration of the first optical member 29 in the present embodiment are not limited in particular. For example, the optical member 29 is a hollow prism (for example, a rectangular prism) constituted by a plurality of mirror surfaces.

The length of the first optical member 29 is, for example, 20 mm, and the length of one side of an exit end 29b is, for example, 0.4 mm. Note, however, that the length of the first optical member 29 and the size of the cross section of the first optical member 29 are not limited to the above.

A laser beam enters the first optical member 29 through an entrance surface 29a, which is one end of the first optical member 29. The laser beam which has entered the first optical member 29 travels while being reflected by the inner surfaces 29c of the first optical member 29, and goes out through the exit surface 29b, which is the other end of the first optical member 29.

The laser beam which has come out through the exit surface 29b is controlled by a lens 3. Through the lens 3, the exit surface 29b of the first optical member 29 and a spot of excitation light incident on a light-emitting section 4 are optically conjugate with each other. Accordingly, the laser beam which has come out through the exit surface 29b is efficiently directed to a laser beam irradiation surface 4a of the light-emitting section 4 by the lens 3. Further, with the lens 3, it is easy to control a spot size of excitation light which strikes the light-emitting section 4.

A laser beam that is emitted from a light-emitting point of a laser chip 21 is light that has a spatial light intensity distribution in the form of a Gaussian profile. The laser beam is converted into light that has a spatial light intensity distribution in the form of a top-hat profile by being repeatedly reflected inside the first optical member 29.

The exit end 29b is positioned inside a cap 25. The laser beam which has come out through the exit end 29b travels to the outside of the laser element 40 through a cap glass 30 provided to the cap 25.

Between the exit end 29b and the cap glass 30, an AR coating film 24a is provided. By providing the AR coating film 24a, it is possible to prevent a reduction in efficiency of emission, which reduction is due to a laser beam reflected at a surface of the cap glass 30 toward inside of the first optical member 29.

<Effects of Laser Element 40>

According to the laser element 40, since a laser beam emitted from the laser chip 21 passes through the first optical member 29, it is possible to convert the spatial light intensity distribution of the laser beam into a top-hat distribution.

As a result, it is possible to irradiate the laser beam irradiation surface 4a with a laser beam having an almost uniform light intensity, and thus possible to prevent the efficiency of conversion by a phosphor from decreasing due to heat of the laser beam.

Further, it is possible to transmit the laser beam with little leakage of the laser beam from the first optical member 29. This makes it possible to increase energy efficiency.

Further, since a tolerance of optical coupling between the first optical member 29 and the laser chip 21 is very large, the laser element 40 is advantageous in that it does not require precise alignment and is also resistant to vibration.

Embodiment 4

Figure 8:
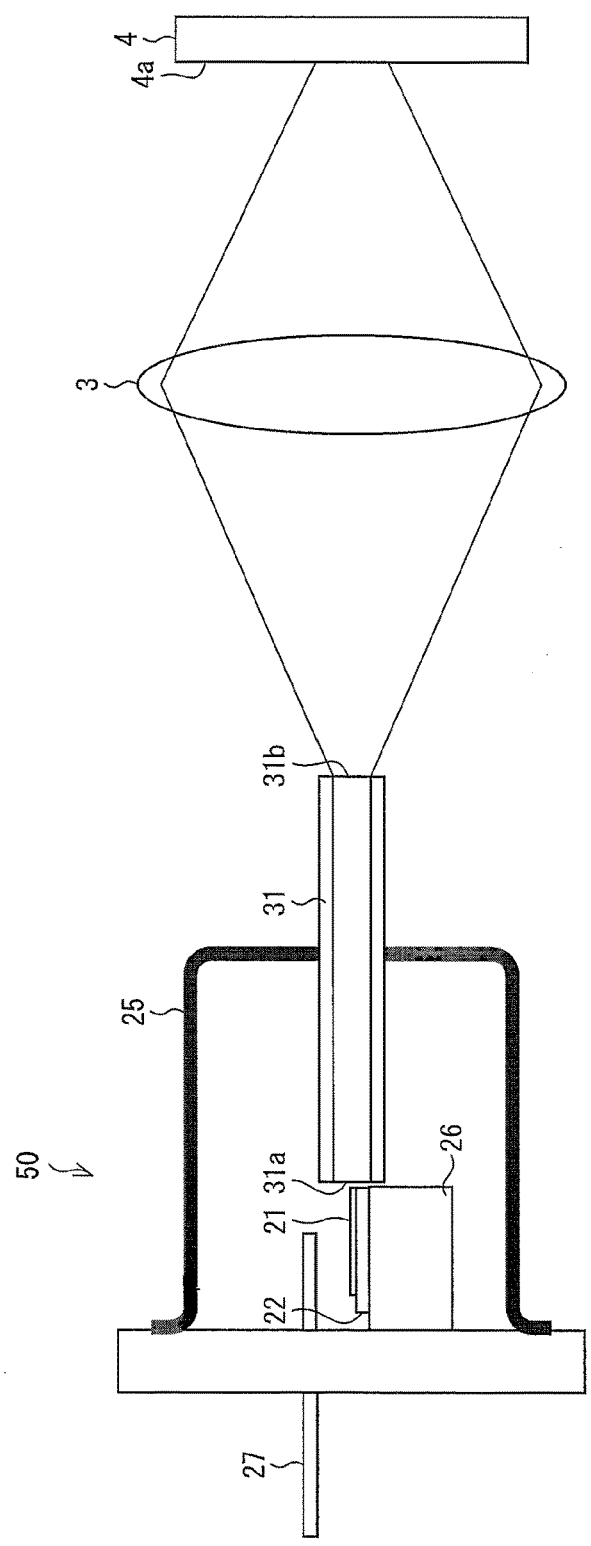
FIG. 8 is a view schematically illustrating a configuration of a laser element in accordance with still a further embodiment of the present invention.

The following description discusses still a further embodiment of the present invention with reference to FIG. 8. Note that members which are the same as those in Embodiments 1 to 3 are assigned identical reference numerals, and their descriptions are omitted here.

According to the present embodiment, the headlamp 1 includes a laser element 50 instead of the laser element 2. The other configurations are the same as those of Embodiments 1 to 3.

<Configuration of Laser Element 50>

FIG. 8 is a view schematically illustrating a configuration of the laser element 50 applicable to the headlamp 1. The laser element 50 includes a multimode fiber (a first optical member) 31 instead of the optical rod 23. The multimode fiber 31 is an optical fiber in which the number of modes of light propagating therethrough is two or more, and has a double-layer structure which is constituted by (i) a core and (ii) a cladding which is lower in refractive index than the core and encloses the core. The core is mainly made of, for example, silica glass (silicon dioxide) which causes little loss of laser beam absorption. The cladding is mainly made of, for example, silica glass or a synthetic resin material which is lower in refractive index than the core.

The length of the multimode fiber 31 is, for example, 20 mm, and the diameter of its end is, for example, 0.4 mm.

However, the length and the diameter of the multimode fiber 31 are not limited to the above.

A laser beam enters the multimode fiber 31 through an entrance surface 31a at one end of the multimode fiber 31. The laser beam which has entered the multimode fiber 31 travels while being reflected inside the core of the multimode fiber 31, and then goes out through an exit surface 31b at the other end.

The laser beam which has come out through the exit surface 31b is controlled by a lens 3. By providing the lens 3, it is possible to cause the exit surface 31b of the multimode fiber 31 and a spot of excitation light incident on a light-emitting section 4 to be optically conjugate with each other, and thus possible to cause the laser beam, which has come out through the exit surfaced 31b, to be efficiently directed to a laser beam irradiation surface 4a of the light-emitting section 4. Further, by providing the lens 3, it is possible to easily control a spot size of the excitation light which strikes the light-emitting section 4.

A laser beam emitted from a light-emitting point of a laser chip 21 is light which has a spatial light intensity distribution in the form of a Gaussian profile The laser beam is converted into light having a spatial light intensity distribution in the form of a top-hat profile by being repeatedly reflected inside the core of the multimode fiber 31.

Note that, an AR coating film 24 can be provided on the entrance surface 31a of the multimode fiber 31 in the same manner as the laser element 2.

<Effects of Laser Element 50>

According to the laser element 50, since a laser beam emitted from the laser chip 21 passes through the multimode fiber 31, it is possible to convert the spatial light intensity distribution of the laser beam into a top-hat distribution.

As a result, it is possible to irradiate the laser beam irradiation surface 4a with a laser beam having an almost uniform light intensity, and thus possible to prevent the efficiency of conversion by a phosphor from decreasing due to heat of the laser beam.

Further, with use of the multimode fiber 31, it is easier to form a longer optical member (for example, 1 m to 5 m) than when using the optical rod 23 or the first optical member 29 (usually, approximately 10 mm to 20 mm long). In a case where an optical member is long, a laser beam is reflected a larger number of times inside the optical member, and thus light intensity distribution becomes uniform. This makes it possible to achieve a spatial light intensity distribution in the form of a top-hat profile which is more uniform in distribution. Furthermore, the long optical member is advantageous also in that it is possible to determine the position of the laser element more freely.

Embodiment 5

Figure 9:
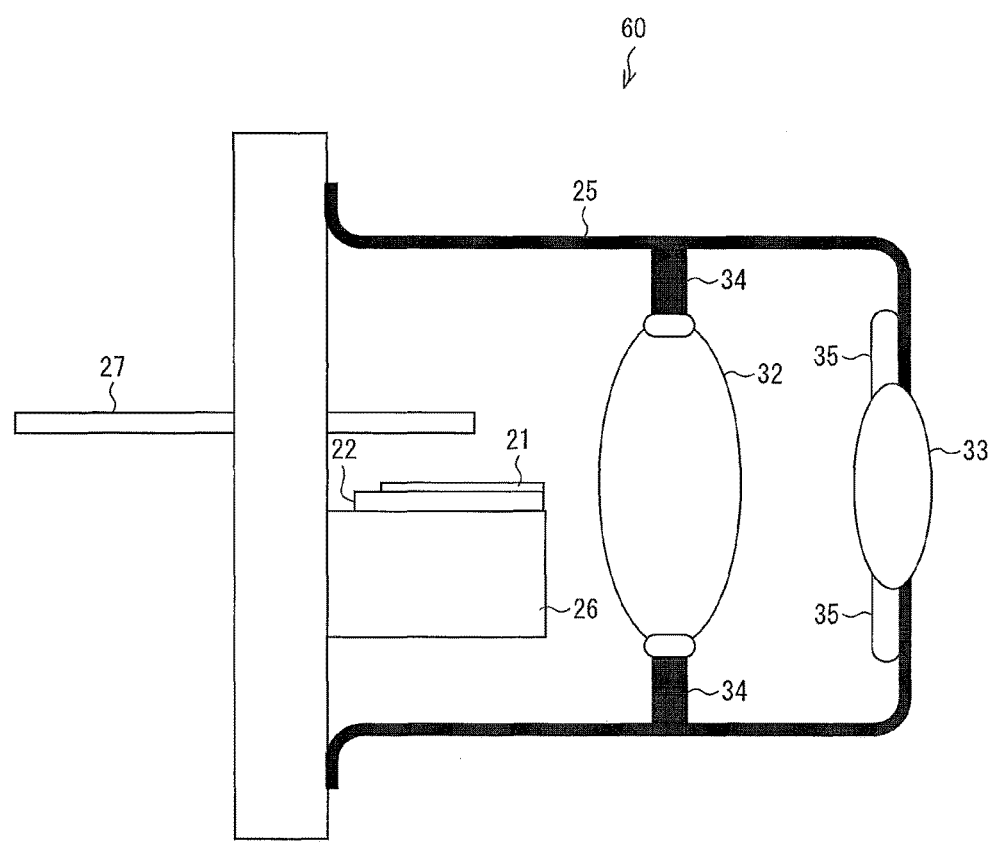
FIG. 9 is a view schematically illustrating a configuration of a laser element in accordance with still yet a further embodiment of the present invention.
Figure 10:
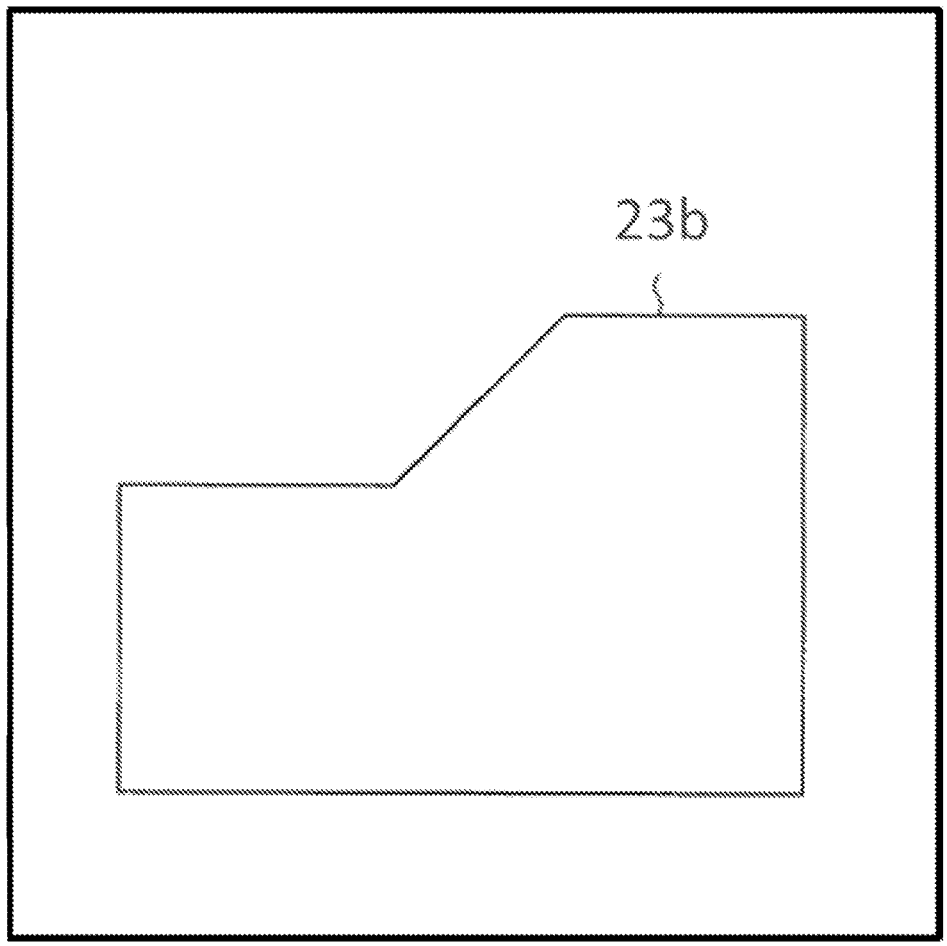
FIG. 10 is a view of an example of the shape of the exit surface of the optical rod.

The following description discusses still yet a further embodiment of the present invention with reference with FIG. 9. Note that members which are the same as those in Embodiments 1 to 4 are assigned identical reference numerals, and their descriptions are omitted here.

According to the present embodiment, the headlamp 1 includes a laser element 60 instead of the laser element 2. The other configurations are the same as those of Embodiments 1 to 4.

<Configuration of Laser Element 60>

FIG. 9 is a view schematically illustrating the laser element 60 applicable to the headlamp 1. The laser element 60 includes a first lens (a first optical member) 32 and a second lens (a first optical member) 33, instead of the optical rod 23.

The first lens 32 concentrates a laser beam emitted from a laser chip 21 to a principal point of the second lens 33, and the second lens 33 directs the laser beam thus concentrated by the first lens 32 to a laser beam irradiation surface 4a of a light-emitting section 4. That is, the laser element 60 is optically arranged such that (i) through the first lens 32, an exit end surface of the laser chip 21 is conjugate with the second lens 33 and (ii) through the second lens 33, the first lens 32 is conjugate with the light-emitting section 4.

The first lens 32 is fixed to a cap 25 with a fixing part 34 made of low-melting glass. The second lens 33 is fixed to the cap 25 with a fixing part 35 made of low-melting glass. Note, however, that how to fix the first lens 32 and the second lens 33 is not limited to the above, and therefore the first lens 32 and the second lens 33 can be fixed in any manner.

The first lens 32 and the second lens 33 can be a pair of convex lenses.

The number of lenses sealed in the laser element 60 is not limited to two, and can be three or more.

Further, the second lens 33 can be provided outside the laser element 60. Specifically, a part of a plurality of lenses which constitute a first optical member can be provided inside the laser element 60, and the other part of the plurality of lenses can be provided outside the laser element 60.

According to a configuration in which the first lens 32 and the second lens 33 are provided, a lens 3 does not necessarily have to be provided. Whether or not to provide a lens 3 can be determined on the basis of the characteristics and/or arrangement of the first lens 32 and the second lens 33.

Further, the second lens 33 can be the same in size as the first lens 32, and also can be larger in size than the first lens 32.

<Effects of Laser Element 60>

According to the laser element 60, it is possible to convert the spatial light intensity distribution of a laser beam emitted from the laser chip 21 into a top-hat distribution by the first lens 32 and the second lens 33.

As a result, it is possible to irradiate the laser beam irradiation surface 4a with a laser beam that has an almost uniform light intensity, and possible to prevent the efficiency of conversion by a phosphor from decreasing due to heat of the laser beam. Further, by using the first lens 32 and the second lens 33 as a first optical member, it is possible to realize a laser element and the headlamp 1 at lower costs than a case of using the optical rod 23 or the like.

A light-emitting device in accordance with an embodiment of the present invention includes a light-emitting section which emits fluorescence upon receiving excitation light from an excitation light source, energy intensity distribution of the excitation light, which is received by the light-emitting section, being a top-hat distribution.

According to the above configuration, the energy intensity distribution of the excitation light received by the light-emitting section is the top-hat distribution. The top-hat distribution is an almost-uniform energy intensity distribution. Therefore, it is possible to prevent the light-emitting section from being excited by excitation light that is locally high in energy intensity, and possible to reduce the possibility of temperature quenching due to locally-high temperature. As a result, it is possible to increase the efficiency of conversion of the excitation light into fluorescence.

Further, it is possible to increase a contrast between a part which is excited and a part which is not excited, and possible to achieve a simple optical design.

Further, it is preferable that the light-emitting device further includes a first optical member which converts the energy intensity distribution of the excitation light into the top-hat distribution.

According to the above configuration, it is possible, in a case where the energy intensity distribution of the excitation light emitted from the excitation light source is for example a Gaussian distribution, to convert the energy intensity distribution into the top-hat distribution by the first optical member.

Further, it is preferable that there is a space between the first optical member and the light-emitting section.

According to the above configuration, it is possible for the light-emitting section to emit, upon receiving the excitation light from the first optical member, fluorescence to the side from which the excitation light comes. Accordingly, it is possible to realize "a reflective light-emitting section" (described later).

Further, it is preferable that the light-emitting device further includes a projection member configured to project illumination light in a desired direction, which illumination light includes the fluorescence emitted from the light-emitting section.

The projection member can be a reflector.

According to the above configuration, it is possible to project, in a desired direction, illumination light which includes fluorescence emitted from the light-emitting section. Further, the light-emitting section, which is excited by excitation light having an energy intensity distribution in the form of a top-hat profile, emits fluorescence having an energy intensity distribution in the form of a top-hat profile. When the projection member projects such fluorescence, almost all beams of the fluorescence emitted from the light-emitting section can be used. This makes it possible to realize a highly efficient projection system.

Note that, in a case where the light-emitting section is excited by excitation light having a Gaussian distribution, part of the light-emitting section, which part is excited by a portion of the excitation light which portion corresponds to the edge portion of the Gaussian distribution, cannot emit fluorescence having a sufficient luminous flux. The fluorescence emitted from the portion corresponding to the edge portion becomes stray light, which is not efficiently used.

Further, it is preferable that the light-emitting device further includes a second optical member which (i) controls a spot size of the excitation light which has come out of the first optical member and (ii) directs the excitation light to the light-emitting section.

According to the above configuration, it is possible to control a spot size of the excitation light which is received by the light-emitting section, and possible to change a range of irradiation with the illumination light.

Further, it is preferable that the first optical member has an exit surface through which the excitation light goes out; and the exit surface is polygonal.

According to the above configuration, since a shape of the exit surface of the optical member is polygonal (for example, rectangle), it is possible, in a case of arranging a plurality of optical members or a plurality of spots of excitation light so that they are in contact with each other, to reduce a space between the plurality of optical members or between the plurality of spots of the excitation light.

Further, it is preferable that the first optical member has an exit surface through which the excitation light goes out; and the exit surface has a shape that corresponds to a desired light distribution pattern.

According to the above configuration, since the exit surface has a shape which corresponds to a desired light distribution pattern, it is possible to cause a light distribution pattern of the illumination light to be the desired light distribution pattern.

The first optical member can include a multimode fiber, a hollow member whose inner surface serves as a reflection surface, or an optical rod.

According to the above configuration, it is possible, in a case where the energy intensity distribution of excitation light emitted from the excitation light source is for example a Gaussian distribution, to convert the energy intensity distribution into the top-hat distribution by the first optical member.

Further, it is preferable that the first optical member includes a first lens and a second lens; through the first lens, the excitation light source is conjugate with the second lens; and through the second lens, the first lens is conjugate with the light-emitting section.

According to the above configuration, it is possible to easily control a spot size of excitation light that is received by the light-emitting section.

Further, it is preferable that the first optical member has an entrance surface which receives the excitation light; and the entrance surface is provided with an antireflection structure.

According to the above configuration, since the antireflection structure (for example, antireflection film (AR coating)) is provided on the entrance surface of the optical member, the excitation light is prevented from being reflected by the entrance surface. As a result, it is possible to reduce losses of the excitation light which losses would occur when the excitation light enters the optical member.

Further, it is preferable that a most intensive part of a distribution of the fluorescence, which is emitted from the light-emitting section, is included in a space where there is a surface of the light-emitting section which surface receives the excitation light, the space being one of two spaces separated by a plane including a surface on which the light-emitting section is provided.

According to the above configuration, fluorescence is emitted to the side from which the excitation light comes (this structure is referred to as a "reflective light-emitting section" in the subject application). According to a structure in which fluorescence is emitted mainly to a side opposite to a side on which there is a surface of the light-emitting section which surface is irradiated with the excitation light (this structure is referred to as a "transmissive light-emitting section"), energy intensity distribution spreads when the excitation light passes through the light-emitting section, and thus heat is also dispersed. In contrast, the reflective light-emitting section does not have such a disadvantage. Therefore, using the optical member in a reflective light-emitting section is especially useful.

Further, a vehicle headlamp including the light-emitting device and an illumination device including the light-emitting device are encompassed in the technical scope of the present invention.

Further, it is preferable that the light-emitting device further includes a first optical member which converts the energy intensity distribution of the excitation light into the top-hat distribution; and the first optical member has an exit surface through which the excitation light goes out, and the exit surface has a shape that corresponds to a light distribution pattern of a low beam to be emitted from the vehicle headlamp.

According to the above configuration, it is possible to cause a light distribution pattern of a vehicle headlamp to comply with the light distribution pattern of a low beam designated by law.

(Additional Remarks)

The present invention is not limited to the description of the embodiments above, but may be altered by a skilled person within the scope of the claims. An embodiment based on a proper combination of technical means disclosed in different embodiments is encompassed in the technical scope of the present invention.

For example, a fly-eye lens can be used to achieve a laser beam having a top-hat distribution. A fly-eye lens is a lens which is made up of a plurality of lenses (double-convex lenses or semi convex lenses) arranged in a matrix manner.

INDUSTRIAL APPLICABILITY

The present invention is applicable to a light-emitting device and an illumination apparatus. The present invention is particularly applicable to a vehicle headlamp, and the like.

REFERENCE SIGNS LIST

1 Headlamp
2 Laser element (Excitation light source)
3 Lens (Second optical member)
4 Light-emitting section
20 Laser element (Excitation light source)
21 Laser chip (Excitation light source)
23 Optical Rod (First optical member)
23a Entrance surface
23b Exit surface
24 AR coating film (Antireflection structure)
29 First optical member
29a Entrance end
29b Exit end
29c Inner surface
24a AR coating film (Antireflection film)
31 Multimode fiber (First optical member)
31a Entrance surface
31b Exit surface
32 First lens (First optical member)
33 Second lens (First optical member)
40 Laser element (Excitation light source)
41 Laser beam spot
50 Laser element (Excitation light source)
60 Laser element (Excitation light source)

The invention claimed is:

1. A light-emitting device, comprising:
a light-emitting section which emits fluorescence upon receiving excitation light from an excitation light source, an energy intensity distribution of the excitation light, which is received by the light-emitting section, being a top-hat distribution;
a first optical member of a straight glass rod having a light entering surface at one end and only one light exiting surface at the other end; and
a second optical member comprising a convex lens,
wherein the excitation light from the excitation light source enters the light entering surface of the first optical member and exits from the light exiting surface of the first optical member,
the excitation light exiting from the light exiting surface of the first optical member is concentrated on the light-emitting section by the second optical member to form a spot of the excitation light,
the light exiting surface of the first optical member and the spot of the excitation light on the light-emitting section are optically conjugate with each other,
the straight glass rod converts the energy intensity distribution of the excitation light into the top-hat distribution,
the light exiting surface of the straight glass rod is separated from the convex lens by air,
an optical axis of the first optical member is aligned with an optical axis of the second optical member, and the optical axes are slanted from a direction perpendicular to a surface of the light-emitting section on which the spot is formed,
the surface of the light-emitting section on which the spot is formed is flat, and
the light entering surface and the light exiting surface of the first optical member have substantially a same surface area.

2. The light-emitting device as set forth in claim 1, wherein there is a space between the first optical member and the light-emitting section.

3. The light-emitting device as set forth in claim 1, further comprising a projection member configured to project illumination light in a desired direction, wherein the illumination light includes the fluorescence emitted from the light-emitting section.

4. The light-emitting device as set forth in claim 3, wherein the projection member is a reflector.

5. The light-emitting device as set forth in claim 1, wherein the second optical member (i) controls a spot size of the excitation light which has come out of the first optical member and (ii) directs the excitation light to the light-emitting section.

6. The light-emitting device as set forth in claim 1, wherein:
the light exiting surface is polygonal.

7. The light-emitting device as set forth in claim 1, wherein:
the light exiting surface has a shape that corresponds to a desired light distribution pattern.

8. The light-emitting device as set forth in claim 1, wherein:
the light entering surface is provided with an antireflection structure.

9. A vehicle headlamp, comprising a light-emitting device as set claim 1.

10. The vehicle headlamp as set forth in claim 9, wherein:
the light exiting surface has a shape that corresponds to a light distribution pattern of a low beam to be emitted from the vehicle headlamp.

11. An illumination device comprising a light-emitting device as set claim 1.

12. The light-emitting device as set forth in claim 1, wherein the light entering surface of the straight glass rod receives the excitation light directly from the excitation light source.

* * * * *